United States Patent [19]

Harzer

[11] 4,220,849

[45] Sep. 2, 1980

[54] CIRCUIT ARRANGEMENT FOR THE CONTROL OF A DIGITALLY SETTABLE LOAD

[75] Inventor: Peter Harzer, Eningen, Fed. Rep. of Germany

[73] Assignee: Wandel & Goltermann, Eningen, Fed. Rep. of Germany

[21] Appl. No.: 909,270

[22] Filed: May 24, 1978

[30] Foreign Application Priority Data

May 24, 1977 [DE] Fed. Rep. of Germany ....... 2723299

[51] Int. Cl.$^2$ ............................................. G06M 3/14
[52] U.S. Cl. .......................... 235/92 DE; 235/92 EV; 235/92 CT; 235/92 MP
[58] Field of Search ....... 235/92 DE, 92 CT, 92 MP, 235/92 CV, 92 PE, 92 EV; 340/347 AD; 328/44, 48

[56] References Cited

U.S. PATENT DOCUMENTS

| | | | |
|---|---|---|---|
| 3,665,323 | 5/1972 | Peterson | 235/92 EV |
| 3,835,384 | 9/1974 | Liff | 235/92 MP |
| 3,843,873 | 10/1974 | Beville et al. | 235/92 MP |
| 3,968,401 | 7/1976 | Bryant | 328/44 |
| 4,065,720 | 12/1977 | Pogue | 235/92 CA |

Primary Examiner—Joseph M. Thesz
Attorney, Agent, or Firm—Ross, Karl F.

[57] ABSTRACT

A manually operated direct-current generator, with an output voltage whose polarity and magnitude depend on the direction and speed of rotation of a control knob, charges a storage capacitor in an input circuit of an operational amplifier which works into two comparators respectively responsive to positive and negative voltages exceeding selected thresholds. A triggerable pulse source, upon actuation by either comparator, feeds back one or more discharge pulses to the storage capacitor and also steps a reversible pulse counter in either a forward or a reverse sense.

8 Claims, 3 Drawing Figures

CIRCUIT ARRANGEMENT FOR THE CONTROL OF A DIGITALLY SETTABLE LOAD

FIELD OF THE INVENTION

My present invention relates to a circuit arrangement for controlling, preferably by hand, a digitally settable load such as a frequency synthesizer or a voltage selector, used for example in a radio transmitter or receiver or in an electronic test circuit, which is to be adjustable in very small increments.

BACKGROUND OF THE INVENTION

A digitally settable frequency synthesizer disclosed in commonly owned U.S. Pat. No. 3,453,542 has a multiplicity of decadic stages associated with respective selector switches. While such individual stage selectors enable the rapid establishment of a desired frequency, they are less convenient for scanning a chosen frequency range since several selectors must be concurrently displaced upon the occurrence of a decimal carry (e.g. upon a switchover from . . .099 to . . .100 Hz). An analogous problem exists in the decadic setting of voltages or other parameters such as gain or bandwidth, for example.

In German Pat. No. 977,780 there is described a superheterodyning receiver in which a ring counter is settable by pulses that are manually generated by the rotation of a control knob. The pulse generator comprises a set of mechanical switches which discriminate, by their sequence of actuation, between the two directions of rotation to drive the counter either forward or backward, at a rate of one step per knob revolution.

OBJECTS OF THE INVENTION

The general object of my present invention is to provide a compact, purely electronic system for translating, without the use of wear-prone mechanical elements, a simple motion of a reversible control element into a succession of signal combinations representative of progressively varying digital values to be used for the setting of a load of the type referred to above.

A more particular object is to provide means in such a system for facilitating a rapid presetting or coarse tuning, followed by a fine adjustment, by making the switching rate a nonlinear—preferably exponential—function of the control motion.

SUMMARY OF THE INVENTION

In accordance with my present invention, I provide a direct-current generator such as a tachometer which is operable to produce a driving voltage of variable polarity and magnitude, as by rotating a knob carried on the generator shaft. A discriminating network connected to that generator emits one of two control signals upon detecting a driving voltage of a respective polarity exceeding (in absolute magnitude) a corresponding, preferably adjustable threshold. A pulse-generating unit, inserted between the discriminating network and a reversible pulse counter, respectively translates the two control signals into forward-stepping and reverse-stepping pulses for that counter which has a plurality of stage outputs connectable to the load, e.g. to corresponding stage inputs of a digital frequency synthesizer of the type described in the aforementioned U.S. Pat. No. 3,453,542.

Pursuant to a more specific feature of my invention, the discriminating network includes a storage capacitor which is chargeable by the driving voltage in the output of the d-c generator and is dischargeable by a feedback connection from the output of that network whose stepping pulses (which are of constant amplitude) progressively deplete the capacitor charge.

In order to facilitate fast switching with only a moderate increase in the speed of shaft rotation, the storage capacitor advantageously forms part of an input circuit of an operational amplifier including nonlinear impedance means, specifically a pair of antiparallel diodes which could be inserted either in a charging path of the capacitor or in a voltage divider serving to bias the inverting input of that amplifier whose noninverting input receives the driving voltage from the d-c generator. The current through these diodes varies substantially exponentially with the voltage difference $\Delta V$ applied thereacross, and so does the output voltage of the differential amplifier which is fed in parallel to a pair of comparators forming part of the discriminating network. Each of these comparators has a first input connected to the amplifier output and a second input connected to a supply of reference potential whose magnitude determines the recurrence frequency or cadence $f_p$ of the stepping pulses. Thus, the pulse cadence $f_p$ generally conforms to the equation $f_p = e^{k \cdot \Delta V}$ where $k$ is a factor depending on the reference potential.

BRIEF DESCRIPTION OF THE DRAWING

The above and other features of my invention wil now be described in detail with reference to the accompanying drawing in which.

SPECIFIC DESCRIPTION

Figure 1:
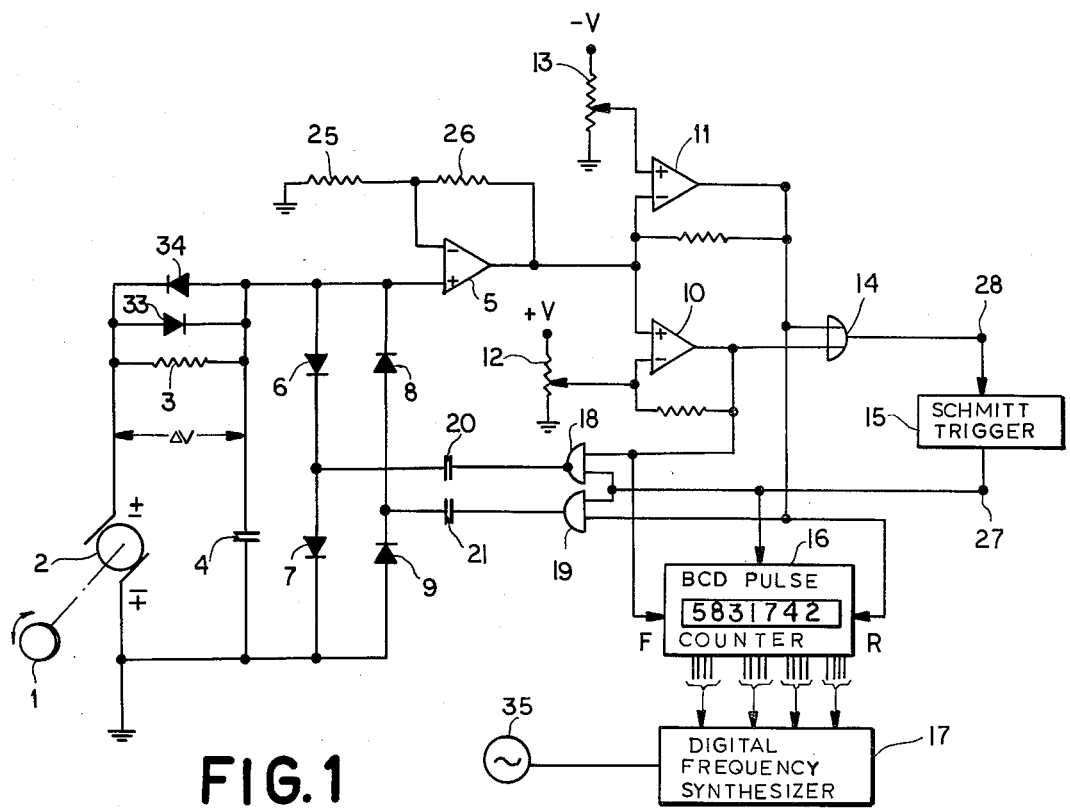
FIG. 1 is an overall circuit diagram of a control system embodying my invention.

In FIG. 1 I have shown a rotatable control knob 1 fixedly mounted on the shaft of a direct-current generator 2, designed as a tachometer, whose output voltage is of one or the other polarity—depending on the direction of knob rotation—and of a magnitude proportional to the rotary speed. A storage capacitor 4 is connected, in series with a resistor 3, across the generator 2 to be charged by the driving voltage developed by the latter. Charging resistor 3 is shunted by a pair of antiparallel diodes 33, 34 which should be omitted if a substantially linear relationship between knob speed and pulse cadence is desired.

Capacitor 4, whose ungrounded terminal is connected to a noninverting input of an operational amplifier 5, is shunted by two pairs of series-connected diodes 6, 7 and 8, 9 which are also in antiparallel relationship with each other. Amplifier 5 has its inverting input connected, in the usual manner, to a tap on a voltage divider inserted between its output and a point of fixed potential (ground), this divider consisting of two series resistors 25, 26.

Two comparators 10 and 11, also designed as operational amplifiers, respectively respond to positive and negative charges of capacitor 4. Comparator 10 has an inverting input tied to the slider of a potentiometer 12 which is connected between ground and a point of positive voltage +V; comparator 11 has a noninverting input tied to the slider of a potentiometer 13 which is connected between ground and a point of negative voltage −V. The noninverting input of comparator 10 and the inverting input of comparator 11 are connected in parallel to the output of amplifier 5. Thus, comparator 10 conducts to emit a first signal voltage when amplifier 5 has a positive output voltage which exceeds the biasing voltage supplied by potentiometer 12; analogously, comparator 11 conducts to emit a second signal voltage when the amplifier has a negative output voltage surpassing in its absolute value the biasing voltage supplied by potentiometer 13. Either of these signal voltages, assumed to be of positive polarity, is passed by an OR gate 14 to an input terminal 28 of a pulse generator—here a Schmitt trigger 15—whose output terminal 27 is tied to respective inputs of a NAND gate 18 and an AND gate 19. NAND gate 18 has another input connected to the output of comparator 10; similarly, AND gate 19 has another input connected to the output of comparator 11. Gate 18 works through a coupling condenser 20 into the junction of diodes 6 and 7 whereas gate 19 works through a coupling condenser 21 into the junction of diodes 8 and 9.

Comparators 10 and 11 also work, respectively, into two control inputs F (forward) and R (reverse) of an up/down pulse counter 16 of BCD type displaying its count in decadic form; in the present instance, the reading of the counter (5,831,742 MHz) is the same as that chosen by way of example for the output of the frequency synthesizer disclosed in U.S. Pat. No. 3,453,542 referred to above. Such a frequency synthesizer 17 is shown connected to the several stage outputs of counter 16 which carry the binary configurations corresponding to digits "3", "1" and "7"; these 4-bit words are decoded within synthesizer 17 and applied to respective stage inputs thereof as taught in that prior patent. Synthesizer 17 receives a reference frequencz (e.g. of 0.1 MHz) from an oscillator 35.

When the knob 1 is manually rotated in one direction or the other, the charge accumulating on capacitor 4 drives the output of amplifier 5 either positive or negative. When the threshold of the corresponding comparator 10 or 11 has been reached, Schmitt trigger 15 is activated by way of OR gate 14 and steps the counter 16 forward or backward, depending on whether control input F or R is energized by comparator 10 or 11. The stepping pulses appearing on terminal 27 are also delivered to gates 18 and 19; in the presence of a positive charge, comparator 10 enables the blocking of the previously conducting NAND gate 18 by these stepping pulses so that condenser 20 feeds back a negative pulse via diode 6 to capacitor 4, whereas in the presence of a negative charge the previously nonconducting AND gate 19 is unblocked by comparator 11 to pass the stepping pulses so that condenser 21 feeds back a positive pulse via diode 8. In either case, the charge present on capacitor 4 is diminished or canceled by these feedback pulses so that the stepping of counter 16 is halted as soon as the rotation of knob 1 is stopped. Coupling condenser 20 or 21 is discharged, after the disappearance of any stepping pulse transmitted to it, via diode 7 or 9, respectively.

Figure 2:
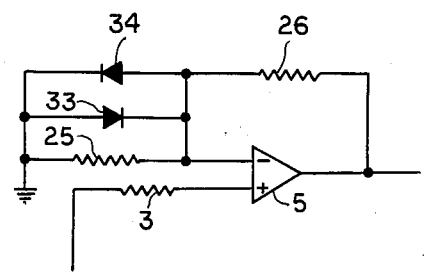
FIGS. 2 and 3 show respective modifications of some of the circuitry of FIG. 1.

With diodes 33 and 34 included in the circuit, the current flowing therethrough increases substantially exponentially with the voltage difference $\Delta V$ existing thereacross. An accelerated rotation of knob 1, therefore, causes a rapid recharging of capacitor 4 and a correspondingly high pulse rate. A similar result can be obtained if, as illustrated in FIG. 2, these diodes are connected in shunt with biasing resistor 25.

Figure 3:
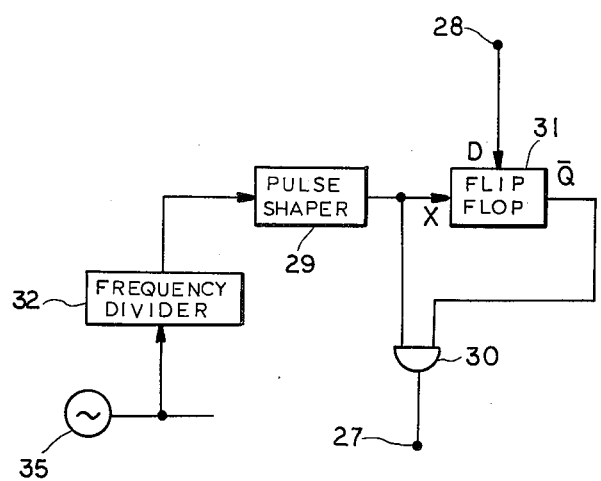

In FIG. 3 I has shown a different pulse-generating unit, synchronized with the operation of the frequency synthesizer 17, connected between terminals 27 and 28 in lieu of the Schmitt trigger 15. This unit comprises a frequency divider 32 which steps down the reference of oscillator 35 and feeds a pulse shaper 29 working into a switching input X of a data-type flip-flop 31. Input terminal 28 is tied to the data input D of this flip-flop whose reset output Q, assumed to go positive when the flip-flop is set, is connected to one input of an AND gate 30 having another input connected to the output of pulse shaper 29; gate 30 works into output terminal 27. As long as terminal 28 is energized, via the OR gate 14 shown in FIG. 1, AND gate 30 is unblocked so that the periodically recurring switching pulses from component 29 are passed to terminal 27. When the storage capacitor 4 (FIG. 1) is sufficiently discharged to de-energize the terminal 28, flip-flop 31 is reset by the next switching pulse and gate 30 is blocked. If desired, a delay line can be inserted between pulse shaper 29 and gate 30 to compensate for the lag in the switchover of the flip-flop.

Knob 1 need not be mounted directly on the shaft of generator 2 but could be coupled therewith through a step-up transmission, for example.

I claim:
1. A circuit arrangement for controlling a digitally settable load, comprising:
   a manually rotatable control knob;
   a tachometer mechanically coupled with said control knob for producing a driving voltage of variable polarity and magnitude depending upon the direction and speed of rotation;
   discriminating means connected to said tachometer for emitting one of two control signals upon detecting a driving voltage of a respective polarity exceeding a corresponding threshold, said discriminating means further including an operational amplifier and a pair of comparators each having a first input connected to the output of said operational amplifier and having a second input connected to a supply of reference potential, said operational amplifier being provided with an input circuit containing a storage capacitor chargeable by said driving voltage;
   a reversible pulse counter with a plurality of stage outputs connectable to the load;
   pulse-generating means operatively connected between said pulse counter and said discriminating means for respectively translating said two control signals into forward-stepping and reverse-stepping pulses applied to said pulse counter; and
   feedback means connected between said pulse-generating means and said storage capacitor for depleting the charge of the latter in response to the generated stepping pulses.

2. A circuit arrangement as defined in claim 1 wherein said input circuit includes nonlinear impedance means for varying the recurrence rate of said stepping pulses generally exponentially with the magnitude of said driving voltage.

3. A circuit arrangement as defined in claim 2 wherein said nonlinear impedance means comprises a resistor shunted by a pair of antiparallel diodes.

4. A circuit arrangement as defined in claim 3 wherein said resistor and diodes are connected in a charging path of said storage capacitor.

5. A circuit arrangement as defined in claim 3 wherein said operational amplifier has a noninverting input connected to said storage capacitor and an inverting input connected to a voltage divider lying between the output thereof and a point of fixed potential, said resistor and diodes being part of said voltage divider.

6. A circuit arrangement as defined in claim 1 wherein said pulse-generating means comprises a Schmitt trigger.

7. A circuit arrangement as defined in claim 1 wherein said pulse-generating means comprises a source of periodically recurring pulses and gating means controlled by said discriminating means for selectively passing the pulses from said source.

8. A circuit arrangement as defined in claim 7 wherein said load is a digital frequency synthesizer provided with a reference oscillator, said source being driven by said reference oscillator.

* * * * *